United States Patent
Wittig et al.

(10) Patent No.: US 7,707,235 B2
(45) Date of Patent: Apr. 27, 2010

(54) FREE-RUNNING NUMERICALLY-CONTROLLED OSCILLATOR USING COMPLEX MULTIPLICATION WITH COMPENSATION FOR AMPLITUDE VARIATION DUE TO CUMULATIVE ROUND-OFF ERRORS

(75) Inventors: Karl Raymond Wittig, New York, NY (US); Geoffrey Francis Burns, Ridgefield, CT (US)

(73) Assignee: NXP B. V., Eindhoven (NL)

( * ) Notice: Subject to any disclaimer, the term of this patent is extended or adjusted under 35 U.S.C. 154(b) by 771 days.

(21) Appl. No.: 10/586,915

(22) PCT Filed: Jan. 25, 2005

(86) PCT No.: PCT/IB2005/050294

§ 371 (c)(1),
(2), (4) Date: Jul. 24, 2006

(87) PCT Pub. No.: WO2005/073829

PCT Pub. Date: Aug. 11, 2005

(65) Prior Publication Data

US 2007/0109027 A1    May 17, 2007

Related U.S. Application Data

(60) Provisional application No. 60/539,725, filed on Jan. 28, 2004.

(51) Int. Cl.
*G06F 1/02* (2006.01)
(52) U.S. Cl. .................................. 708/270; 708/275
(58) Field of Classification Search ............... 708/275, 708/276, 440, 441
See application file for complete search history.

(56) References Cited

U.S. PATENT DOCUMENTS

| | | | | |
|---|---|---|---|---|
| 3,633,017 A | * | 1/1972 | Crooke | 708/276 |
| 5,473,385 A | | 12/1995 | Leske | |
| 5,699,383 A | * | 12/1997 | Ichiyoshi | 375/297 |
| 6,281,823 B1 | | 8/2001 | Gross, Jr. et al. | |
| 6,981,011 B1 | * | 12/2005 | Napolitano | 708/270 |
| 2003/0063678 A1 | | 4/2003 | Crawford | |

FOREIGN PATENT DOCUMENTS

| | | |
|---|---|---|
| EP | 535591 A2 | 4/1993 |
| EP | 1049301 A2 | 11/2000 |
| EP | 1 215 558 A2 | 6/2002 |
| EP | 1 357 460 A2 | 10/2003 |
| GB | 2288086 A | 10/1995 |

OTHER PUBLICATIONS

International Preliminary Report on Patentability for int'l. patent appln. PCT/IB2005/050294 (Jul. 31, 2006).

* cited by examiner

*Primary Examiner*—Chuong D Ngo

(57) ABSTRACT

A method and apparatus for efficiently generating complex sinusoids of a desired frequency by multiplying a phasor by a predetermined value once every sampling interval, and using the highest order bits within the phasor to identify if the phasor is at an integer multiple 45 degrees and substituting components in the phasor if it is determined that the phasor is an integer multiple of 45 degrees. If the phasor is not identified as being an integer multiple of 45 degrees then an error factor for both the real and imaginary components is determined and the real and imaginary components are corrected by removing the error factor.

17 Claims, 5 Drawing Sheets

FREE-RUNNING NUMERICALLY-CONTROLLED OSCILLATOR USING COMPLEX MULTIPLICATION WITH COMPENSATION FOR AMPLITUDE VARIATION DUE TO CUMULATIVE ROUND-OFF ERRORS

CROSS REFERENCE TO RELATED APPLICATION

This application claims the benefit of U.S. provisional application Ser. No. 60/539,725 filed Jan. 28, 2004, which is incorporated herein by reference.

The present invention relates to numerically controlled oscillators and, more particularly, to the correction of cumulative approximation or round-off errors within numerically controlled oscillators.

The demodulation of a transmitted signal often requires down-conversion to baseband, which in turn requires mixing with, or multiplication by, a locally generated sinusoidal signal having the same carrier or intermediate frequency as the signal to be down-converted. In a digital channel demodulation system, this function is typically performed using a numerically controlled oscillator (NCO). The capability of an NCO is desirable to digitally generate trigonometric functions of a linearly varying phase angle. Exceptions are cases wherein the desired frequency is either a small integer multiple of the digital sampling frequency such that the Nyquist frequency is reached, or a fraction whose numerator and denominator are both small integers.

Digital channel demodulation often requires a free-running source of sinusoidal signals of a given frequency, such as provided by a numerically controlled oscillator. Such an oscillator can be implemented using the successive multiplication of a complex number by a complex constant that corresponds to the desired frequency. A well-known problem with this method is that the amplitude of the resulting signal is unstable, and will either increase or decrease as a result of cumulative approximation or round-off errors. A numerically controlled oscillator (NCO) synthesizes a range of frequencies from a fixed time base.

Numerically controlled oscillators have conventionally been implemented either a look-up table or the CORDIC (Coordinate Rotation Digital Computer) algorithm for complex phasor rotation. Problems exist with either implementation. For a high degree of numerical precision, look-up tables can require large amounts of memory and CORDIC algorithms can require numerous stages of digital hardware. One well-known method of implementing an NCO is to use a look-up table having a digital memory addressed by the current phase angle of the oscillator, and the contents of the digital memory are the numerical values of the desired sinusoidal function corresponding to each phase angle. The size of the memory increases exponentially with the required phase angle precision (i.e., it doubles in size for every additional binary digit), and linearly with the precision of the sinusoidal value. If arbitrary values are required for the phase angle, the size of the required look-up table can become very large, requiring a large area if implemented on an integrated circuit device. A second well-known method of digitally generating sinusoidal functions is an iterative procedure that uses the CORDIC algorithm, in which the desired sinusoidal function is successively approximated. In conventional implementations, the CORDIC algorithm increases the precision by a factor of two every iteration that is performed. The CORDIC algorithm can be implemented in software executed on a computer. The CORDIC algorithm can also be implemented in a digital circuit, with one stage required per iteration of the CORDIC algorithm performed. The software implementation requires resources in the form of computational overhead such as processor execution time, and the digital circuit implementation requires resources in the form of area on an integrated circuit device. If a high degree of numerical precision is desired, than a substantial amount of resources are required to implement the CORDIC algorithm.

From the foregoing discussion, it should be readily apparent that there remains a need within the art for a numerically controlled oscillator that requires fewer resources than those currently available.

This invention addresses the shortcomings within the prior art where the amplitude of the resulting signal becomes unstable and eventually increases or decreases as a result of cumulative approximation or round-off errors by providing a simple and efficient method of correcting for such variations, so that the oscillator signal amplitude remains constant. The invention employs successive complex multiplications to implement a numerically controlled oscillator that requires a smaller amount of resources than either the use of look-up tables or CORDIC algorithms resulting in a simple and efficient method of solving the stability problem. The invention can be implemented using custom-designed discrete logic in an integrated circuit, a systolic or other reconfigurable processor array in which as few as only one processor may be required for this function.

These and objects of the invention are provided by efficiently generating complex sinusoids of a desired frequency by multiplying a current phasor by a predetermined value once every sampling interval to create a next phasor, identifying if a zero value condition exist within either real or imaginary components of the next phasor and substituting a complementary component of unity amplitude to complex phasor components that exhibit the zero value condition, identifying if a condition of equality exits between for real and imaginary components of the next phasor and substituting an equal component for both real and imaginary components of the next phasor if the condition of equality is identified, and if the zero value condition of the condition of equality are not found, determining an error factor for real and imaginary components of the next phasor and correcting the real and imaginary components by removing the error factor.

Figure 1A:
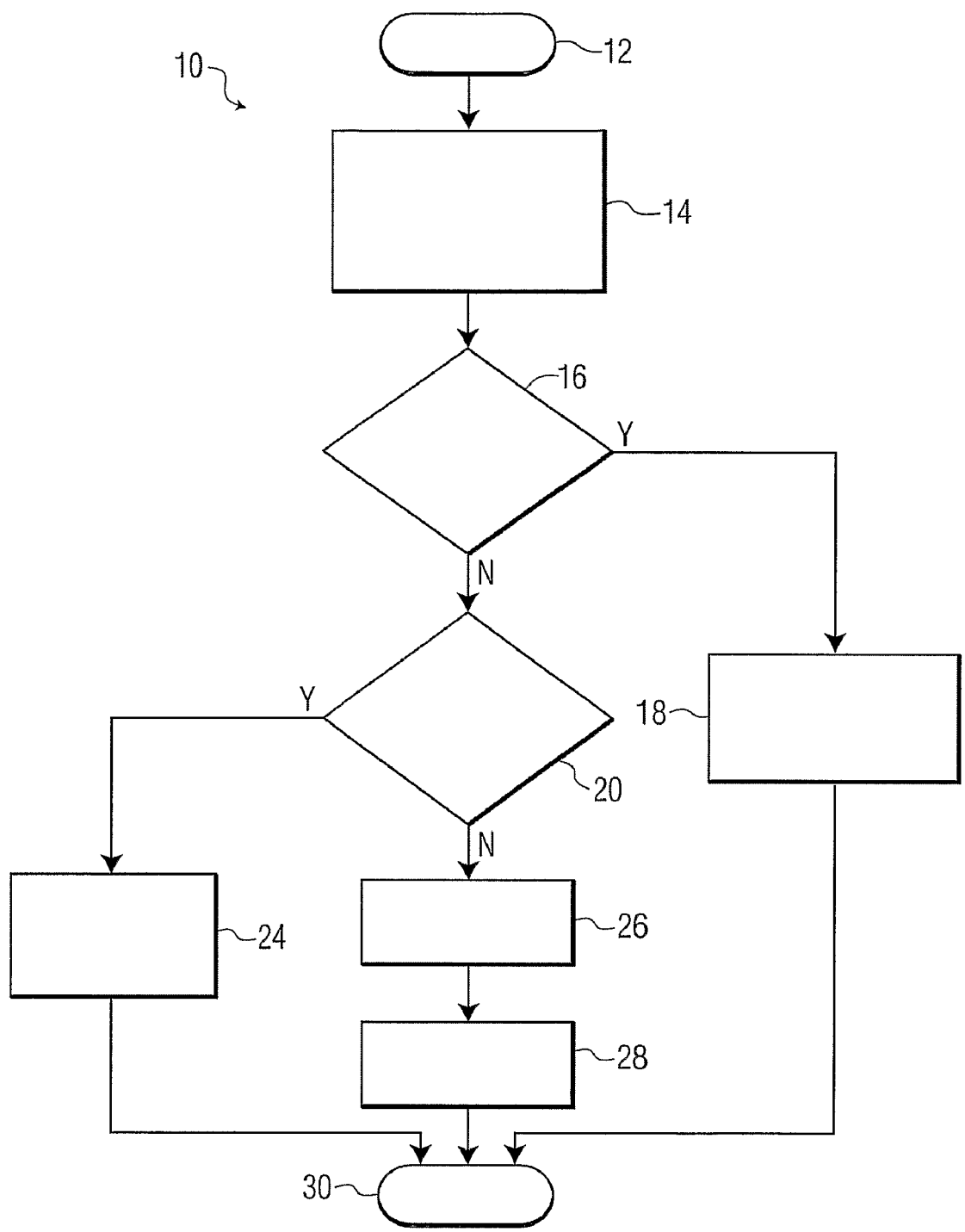
FIG. 1a is a flow diagram illustrating the functions performed by the invention.
Figure 1B:
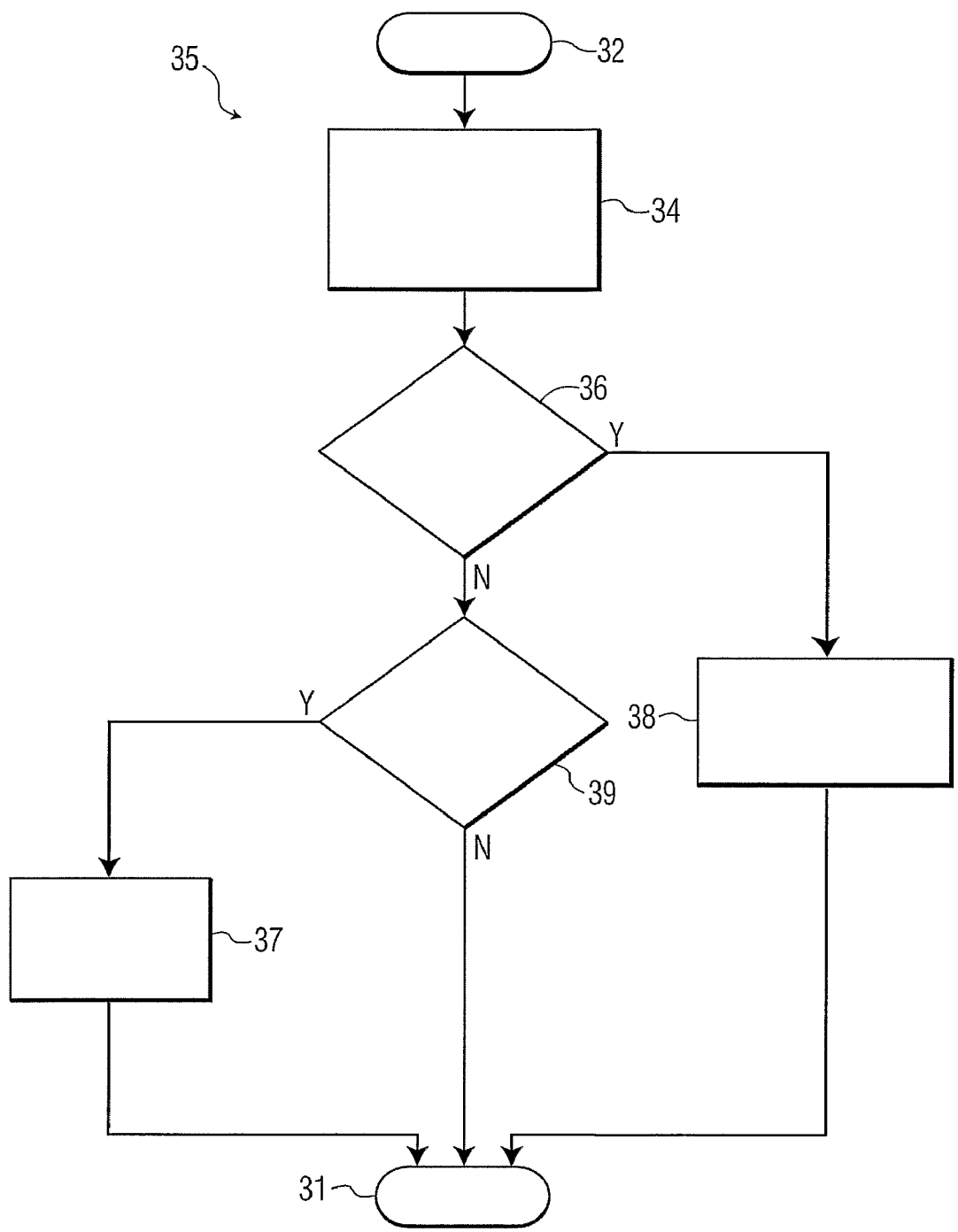
FIG. 1b is a flow diagram illustrating the functions performed by the invention.
Figure 1C:
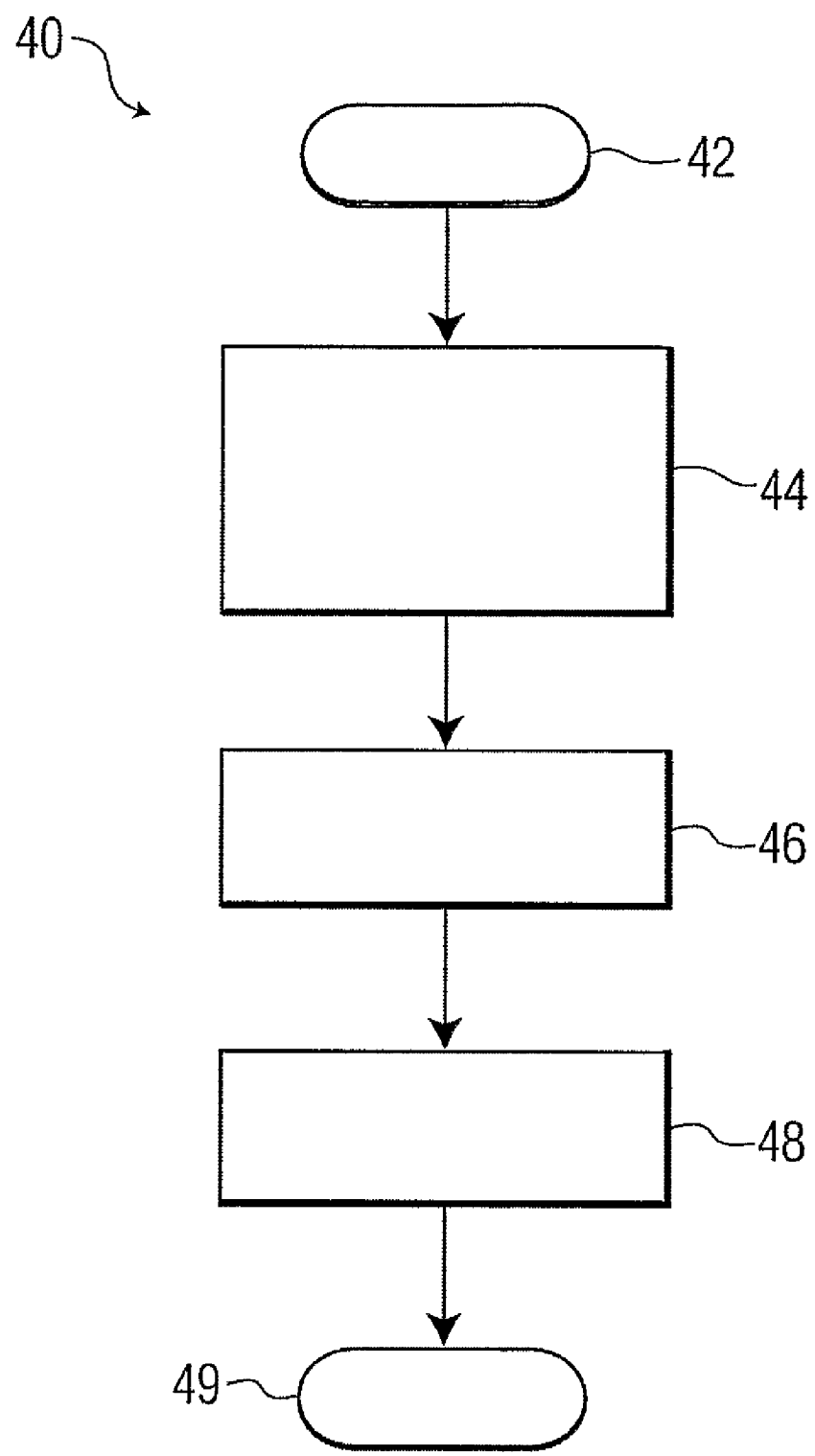
FIG. 1c is a flow diagram illustrating the functions performed by the invention.
Figure 3:
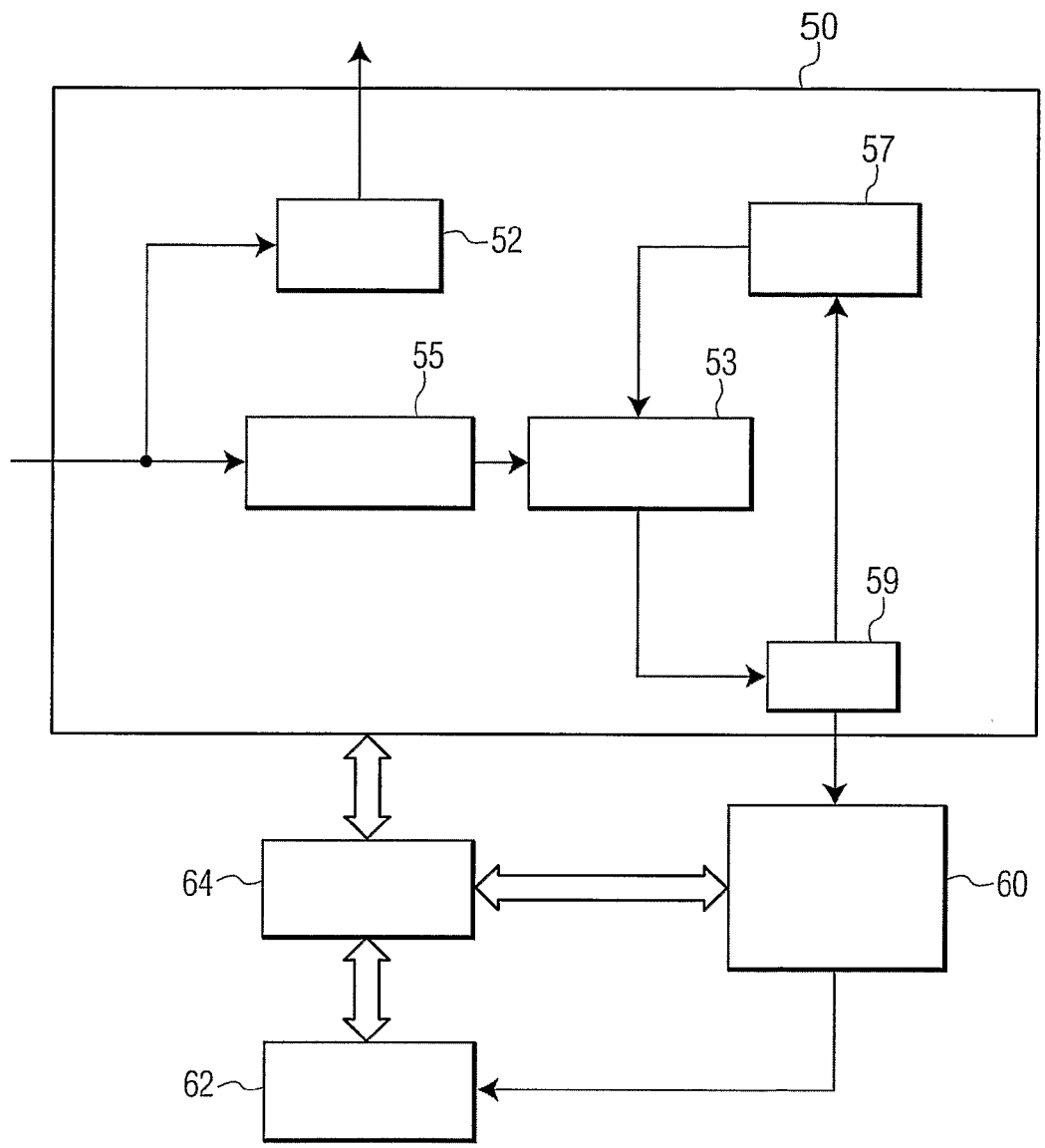

FIG. 3. is a block diagram for a channel demodulator that can employ the flow diagram of FIG. 1a, FIG. 1b and FIG. 1c.

It has been discovered that sinusoidal functions can be digitally generated using fewer resources for the rotation of a complex phasor. In the complex domain, the rotation of a complex phasor by a given angle corresponds to a complex multiplication by a second complex phasor whose value, having real and imaginary components, is determined strictly by the phase angle increment. A free-running oscillator in the discrete-time digital domain corresponds to a repetitive increase in the phase angle by a constant amount during each sampling interval. Such an oscillator can be created by successive multiplications of an initial complex phasor by the aforementioned second phasor. In this arrangement, the norm, or magnitude, of the resulting phasor must always equal unity. Any variation from unity will result in either a progressive decrease in magnitude, which will eventually become infinitesimal, or a progressive increase that will continue without bounds. It is well known in the arithmetic of complex numbers, that if the magnitude of the second phasor exactly equals unity, the resulting magnitude will remain constant indefinitely. However, this constant result is a condition that is only be guaranteed in an abstract mathematical sense, which an actual digital signal processing system cannot realistically achieve. Consequently, the generation of sinusoidal functions within digital systems require a mechanism for preventing, or correcting, the aforementioned long-term increase or decrease in phasor magnitude.

Referring to FIG. 3, a block diagram of a digital channel demodulator 49 has a digital front end 50. The present invention is useful in the area of baseband conversion 55 within front end 50. These and conversion 55 receives a digital input which is also received by the automatic gain control (AGC) 52. AGC 52 provides an analog output. The baseband conversion 55 generally provides without conversion of higher frequencies, typically by mixing signals. Sample rate conversion 53 provides adjustments to frequencies employed by baseband conversion 55. Baseband conversion 55 as shown in FIG. 3 includes a function for carrier recovery to lock in on the down converted frequency. Sample rate conversion 53 will adjust the clock rate to make the same as the sampling rate. Ideally, it is desired that the clock rate and the sampling rate should be the same. The down conversion of a signal to base band results in the entire process being able to proceed at a slower sampling rate. Another function of sample rate conversion 53 as simply to ensure that the clock rate and the sampling rate are the same. Filter 59 will provide a Nyquist filter and decimation of the sample rate converted signal. The Nyquist filter prevents aliasing. For example if you have a 20 MHz sampling rate and a signal having a frequency of less than 5 MHz, then many alternate samples can be removed, however, is necessary to filter the signal first to remove anything above 5 MHz. Timing recovery 57 provides a feedback loop from filter 59 to sample rate conversion 53. Once signals that have been baseband converted 55 and sample rate conversion 53, the filtered signal will be received by the channel estimation and correction 60. The channel estimation and correction 60 will typically provide channel estimation, time interpolation, and frequency interpolation. Channel decoder 62 will receive the estimated and corrected channel data from channel estimation correction 60. Channel decoder 62 will typically provide an output interface for MPEG data that has been the scrambled and decoded by channel decoder 62. System controller 64 typically provides control signals to front end 50, channel estimation and correction 60 and channel decoder 62. The digital channel demodulator 49 illustrated in FIG. 3 will demodulate a transmitted signal by down converting the signal to a baseband level by baseband conversion 55, which requires mixing with, or multiplication by, a locally generated sinusoidal signal having the same carrier or intermediate frequency as the signal to be down-converted. In conventional digital channel demodulation systems, this function is typically performed using a numerically controlled oscillator (NCO). The capability of an NCO is desirable to digitally generate trigonometric functions of a linearly varying phase angle. The baseband conversion 55 will provide for the mixing of sinusoidal signals in a manner that avoids problems within the prior art methods for conversion of signals to baseband that implemented the NCO as a lookup table or CORDIC implementation. The baseband conversion 55 employed by the preferred by the invention is described below.

Referring to FIG. 1a, the present invention provides a simplified manner of detecting and correcting for the aforementioned long-term variations. The present invention employs known properties of complex numbers to perform the required compensations. The complex product of two complex numbers x+jy is given by the relationship a+jb and c+jd as illustrated in Equations 1a and 1b below.

$$x+jy=(a+jb)(c+jd) \qquad \text{Equation 1a}$$

$$x+jy=(ac-bd)+j(ad+bc) \qquad \text{Equation 1b}$$

For an initial complex value c+jd successively multiplied by a second complex value a+jb n times, the result is given by Equation 2.

$$x+jy=(a+jb)^n(c+jd) \qquad \text{Equation 2}$$

When this same multiplication is performed n+1 times, the result is given by the relationships shown in Equations 3a and 3b.

$$x'+jy'=(a+jb)^{n+1}(c+jd) \qquad \text{Equation 3a}$$

$$x'+jy'=(a+jb)(x+jy) \qquad \text{Equation 3b}$$

A consequence of Equation 3b is that the desired result can be obtained by repeatedly multiplying the current phasor value by a+jb once for every sampling interval. The algorithm 10 shown in FIG. 1 is run every sampling period by the preferred embodiment. If the magnitude of a+jb is exactly unity, the result will be equivalent to a free-running numerically controlled oscillator. Since it is very well known that any complex number can be expressed in the polar form, Equation 4 below corresponds to a phase angle having unity magnitude.

$$a+jb=\cos\theta+j\sin\theta=e^{j\theta} \qquad \text{Equation 4}$$

The value of this complex number for a given phase angle is determined as a function of the ratio of the desired oscillator frequency to the digital sampling rate. The numerically controlled oscillator can be implemented by repeatedly multiplying the complex phasor with this predetermined complex number during every sampling interval. This process requires one complex multiplication, which in turn comprises four real multiplications and two real additions, as demonstrated in the above expression for a complex product. Using current technology, the foregoing process requires fewer resources than either a look-up table or a CORDIC implementation, but still requires that the magnitude of the complex phasor remain at unity.

Satisfaction of the unity magnitude criterion, typically, requires determination of the complex magnitude of the phasor (two multiplications, an addition, and a square root operation), followed by multiplication of the phasor by the reciprocal of this magnitude (two division operations). The resources required for these operations would be prohibitively expensive.

Referring to FIG. 1a, the desired determinations and corrections are performed using well-known properties of complex numbers under appropriate conditions that will subsequently be described. The algorithm 10 of FIG. 1a will begin 12 at predetermined periods which are determined during the system design process. During the system design process these parameters are determined by identifying how quickly the accumulated round-off errors that require correction. Multiply Current Phasor by a predetermined value 14 will perform the complex operation of multiplying the current phasor value by a+jb once for every sampling interval as shown in the relationship of Equation 3b. Zero value condition 16 will determine if either real component is zero or if the imaginary component is zero. If the phase angle is an even integer multiple of 90 degrees (0 or 180 degrees), the complex phasor is a pure real number, and its imaginary component is zero. Consequently, the real component must equal unity under these conditions. It is a simple matter to detect the condition of a zero for the imaginary component (or of any zero numerical value, for which all binary digits, in the representation used for a digital signal processing system, equal logic 0). Whenever this condition is detected, substitute component of unity amplitude 18 will replace the value of the real component with a value for positive or negative unity, depending upon the sign of the original value. If the phase angle is an odd integer multiple of 90 degrees (90 or 270 degrees), zero value condition 16 will detect that the complex phasor is a pure imaginary number, and its real component is zero. Using the arguments given above, the imaginary component must equal unity (once again, positive or negative), and thus substitute component of unity amplitude 18 will replace the value of the imaginary component with a value for positive or negative unity, depending upon the sign of the original value. The resources required for this procedure consist simply of two comparisons with zero to make the determination, and one substitution of a complex number component with a constant value (i.e., unity). Clearly, this is much more reasonable for a practical implementation than the direct methods of the prior art.

A variation of the above discussed implementation results in cases wherein the phase angle of the complex phasor is an odd multiple of 45 degrees (the even multiples of 45 degrees are just the multiples of 90 degrees that were considered above). If complex phasor is an odd multiple of 45 degrees, the absolute value of the real component must equal that of the imaginary component and this condition of equality 20 will be detected by the algorithm 10. In particular, the absolute value of the real component and that of the imaginary must both have an absolute value of 0.70710678 (the square root of ½), this follows from a well-known property of complex numbers. Substituting equal components 24 insures that once the condition of equality is detected, each of the real and imaginary components are be replaced by the positive or negative of 0.70710678, depending upon the sign of the original component. Once again, this is done without regard to the actual values. The resources required for this procedure are simply one equality comparison to make the determination, and two substitutions of complex number components with a constant value. Again, this is a much more reasonable approach for a practical implementation than the direct method of the prior art.

Referring now to FIG. 1*b* and FIG. 1*c*, the various steps that are performed by the flowchart are performed in two parts. Each of FIG. 1*b* and FIG. 1*b* represent the most preferred embodiments of the invention with the flowchart of FIG. 1*b* being the most preferred embodiment. In FIG. 1*b*, the algorithm, generally referred to as 35, will perform multiply current phasor by predetermined value 34 as previously described followed by testing for zero value condition 36, which is the identical test performed in FIG. 1*a* as previously described. Substituting components of unity amplitude 38 will be performed if the zero condition is found to exist and the condition of equality exit 39 will be performed if the zero condition is false as described in FIG. 1*a*. The algorithm performed in FIG. 1*b* is the most preferred because it is the most efficient and requires the fewest resources. In most applications, it is envisioned that the algorithm 35 shown in FIG. 1*b* will be sufficient because the round-off errors and truncation errors do not have to be constantly fixed, periodic fixes are sufficient.

In FIG. 1*c*, the steps that were performed in FIG. 1*a* but not performed in FIG. 1*b* are performed. The reasoning here is that in certain applications or systems, relying on the 45 degree adjustments alone as shown in FIG. 1*b* may not trigger a sufficient number of corrections. The steps shown in FIG. 1*c* will provide corrections at predetermined interals. Iterations of the algorithm 40 shown in FIG. 1*c* will be performed every so often as determined necessary with begin 42 and perform multiply current phasor by predetermined value 44 in the same manner as described in the foregoing discussion to FIG. 1*a*. Then determine error factor 46 will calculate the error factor as previously described in the discussion to FIG. 1*a* and remove error factor will eliminate the calculated error factor. The predetermined interval will be determined during the system design process and the algorithm of FIG. 1*c* will performed in accordance with the those parameters. The algorithm of FIG. 1*c* requires more resources than that of FIG. 1*b* but will insure that corrections are constantly being made. The algorithm 10 of FIG. 1*a* provides the combination of both FIG. 1*b* and FIG. 1*c* and is also envisioned by the invention.

Figure 2:
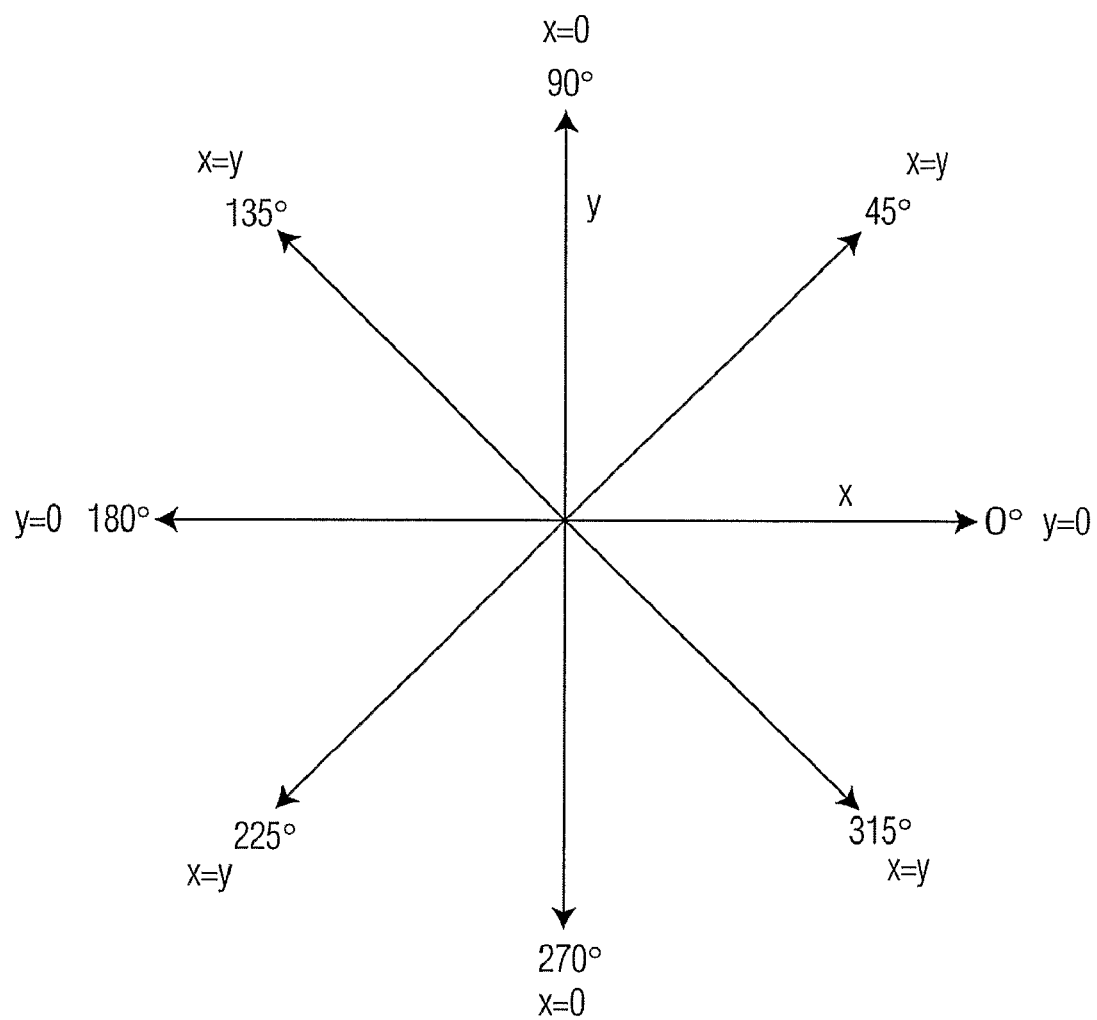
FIG. 2 is a phasor diagram illustrating concepts of the invention.

The substitutions described above can be combined in a single system, resulting in eight possible conditions under which the correction of the invention could be performed instead of just four. The detection points, according to the above schemes, are illustrated in FIG. 2. In FIG. 2, y=0 is illustrated at 0 and 180 degrees. Other zero points are illustrated for x=0 at 90 degrees and 270 degrees. All the foregoing zero points will have unity components substituted within the phasor. At 0 degrees, a unity value of x=1, y=0; at 90 degrees unity value of x=0, y=1; at 180 degrees unity value of x=−1, y=0; and at 270 degrees unity value of x=0, y=−1; will be substituted for the phasor components. Also shown in FIG. 2, integer multiples of 45 degrees for the phase angle will result in components having equal absolute value being substituted within the phasor. At 45 degrees, a equal absolute value components of x=0.707, y=0.707; at 135 equal absolute value components of x=−0.707, y=0.707; at 225 equal absolute value components of x=−0.707, y=−0.707; and at 315 degrees equal absolute value components of x=0.707, y=−0.707; will be substituted for the phasor components.

For the above-described schemes to work properly, it is necessary that the conditions being detected arise with some regularity; otherwise, the required corrections will never be performed. In order to best insure this, it is necessary that the desired oscillator frequency NOT be too closely related to the digital sampling rate of the system. If their ratio is a simple fraction consisting of small integers, it is possible, or even likely, that the complex phase angle will only assume a restricted number of values during operation, and the above detection conditions might not be met. In these cases, either a small look-up table, or discrete digital logic, can be used to implement the numerically-controlled oscillator, so that there is not as great a need for more efficient use of resources.

In order to increase the frequency at which the required conditions are detected, it is possible to examine only the higher-order binary digits, or bits, of the complex phasor components, for which these conditions will arise more often. The number of bits thus examined can be chosen on the basis of the maximum acceptable "jump" in the amplitude of the numerically-controlled oscillator that would be permitted during normal operation. The zero detection is performed by ascertaining that all of the selected higher-order bits equal either logic 0 or logic 1 (the latter case corresponds to a very small negative value); these comparisons require a single NOR function and a single AND function, respectively. The equality comparison is performed by ascertaining that all of the corresponding high-order bits of the two complex components (or the bitwise inverse of one component, in cases where the two have opposite signs) are equal; this requires two exclusive-OR functions for each considered bit (one for the sign inversion of one component, when required, and one for the actual comparison), and one AND function for the results of all bit comparisons.

The rate of amplitude variation will be fairly slow for any free-numerically-controlled oscillator in which the components of the complex phasor are represented by a reasonable number of binary digits. Accordingly, it is possible to correct the phasor magnitude on a regular basis without need for the detection of special conditions, the arising of which must be waited for. Although the proposed method to be described requires greater resources than the methods described above, it nevertheless requires far fewer resources than the direct method, and is therefore much more practical.

If the magnitude of the complex phasor changes only a small amount over a period of time as a result of accumulated round-off error, this change can be approximated, and the approximation can be used to perform the required compensation. Equation 5 below gives the relationship for a phasor magnitude of r, with real and imaginary components x and y, that is perturbed by an increment, $\epsilon$, much smaller than unity.

$$r = 1.0 + \epsilon; \; \epsilon \ll 1.0 \qquad \text{Equation 5}$$

Therefore, the square of the phasor magnitude for r is represent by Equation 6.

$$r^2 = x^2 + y^2 \approx 1.0 \qquad \text{Equation 6}$$

Accordingly, the increment of the squared modulus is given by the relationships of Equations 7a, 7b and 7c.

$$\Delta(r^2) = r^2 - 1.0 = (1.0 + \epsilon)^2 - 1.0 \qquad \text{Equation 7a}$$

$$\Delta(r^2) = 1.0r^2 + 2\epsilon + \epsilon^2 - 1.0 \qquad \text{Equation 7b}$$

$$\Delta(r^2) \approx 2\epsilon \qquad \text{Equation 7c}$$

Therefore, the increment, $\epsilon$, is the error determination which can be represented by the relationship shown in Equations 8a and 8b. Determine error factor 26 within the preferred embodiment will determine this error factor using the relationships shown in Equations 8a and 8b.

$$\varepsilon \approx \frac{\Delta(r)^2}{2} \qquad \text{Equation 8a}$$

$$\varepsilon = \frac{(x^2 + y^2 - 1.0)}{2} \qquad \text{Equation 8b}$$

The correction factor for the x and y components of the complex phasor can then be represented by the relationship of Equation 9, which is performed by remove error factor 28.

$$\frac{1.0}{r} = \frac{1.0}{1 + \varepsilon} \approx 1.0 - \varepsilon \qquad \text{Equation 9}$$

The error determination can be performed using two multiplications, two additions, and one right shift operation (division by 2).

Consequently, the corrected complex components x' and y' are given by Equations 10a and 10b.

$$x' \approx x(1.0 - \epsilon) = x - \epsilon x \qquad \text{Equation 10a}$$

$$y' \approx y(1.0 - \epsilon) = y - \epsilon y \qquad \text{Equation 10b}$$

The correction can be performed using one multiplication and one subtraction. Clearly, this is much more efficient than the direct method, which requires the extremely expensive square root and reciprocal operations.

This invention is especially useful in the front-end portion of digital signal processing systems that perform channel demodulation in which down-conversion of an input signal by an arbitrary frequency not closely related to the sampling rate is required. It can be implemented in hardware using discrete logic on an integrated circuit, or in software that is executed on a computer processor. In particular, it lends itself to a very efficient implementation on a systolic array consisting of a multiplicity of small processors running at an instruction rate that is not a very large multiple of the sampling rate. On such an array, it can be implemented using one or at most a small number of such processors.

The invention claimed is:

1. A method for generating complex sinusoids of a desired frequency using an oscillator comprising the steps of:
    multiplying a current phasor by a predetermined value (14) once every sampling interval to create a next phasor by the oscillator;
    identifying if a zero value condition exists within either real component of the next phasor or imaginary component of the next phasor by the oscillator; and
    if the zero value condition exists, substituting a complementary component of the real component or the imaginary component of the next phasor that exhibits the zero value condition with a complex component that has unity amplitude by the oscillator.

2. The method of claim 1 further comprising:
    if the zero value condition does not exist, identifying if a condition of equality exists between absolute value of the real component of the next phasor and absolute value of the imaginary component of the next phasor;
    if the condition of equality exists, substituting both the real and imaginary components of the next phasor with a complex component that has a square-root of one-half unity amplitude.

3. The method of claim 2 further comprising:
    if the condition of equality does not exist, determining an error factor for the real and imaginary components of the next phasor and correcting the real and imaginary components by removing the error factor.

4. The method of claim 3, wherein the error factor, the real and imaginary components of the next phasor and corrected real and imaginary components satisfy:

$$x' = x - \varepsilon \times x,$$

$$y' = y - \varepsilon \times y,$$

where $\epsilon$ represents the error factor, x and y represent the real and imaginary components of the next phasor, respectively, and x' and y' represent the corrected real and imaginary components of the next phasor, respectively.

5. The method of claim 4, wherein the error factor and the real and imaginary components of the next phasor satisfy:

$$\varepsilon = \frac{x^2 \times y^2 - 1.0}{2}.$$

6. The method of claim 2, wherein the identifying if the zero value condition exists within either the real component of the next phasor or the imaginary component of the next phasor comprises examining a plurality of highest order bits of the next phasor for the zero value condition, and wherein the identifying if the condition of equality exists between the real component of the next phasor and the imaginary component of the next phasor comprises examining a plurality of highest order bits of the next phasor for the condition of equality.

7. The method of claim 6, wherein the examining the highest order bits of the next phasor for the zero value condition comprises determining if all the highest bits of the next phasor are either a logical 0 or a logical 1.

8. The method of claim 1, wherein the identifying if the zero value condition exists within either the real component of the next phasor or the imaginary component of the next phasor comprises identifying whether either the real component of the next phasor is zero or whether the imaginary component of the next phasor is zero, wherein the substituting the complementary component of the real component or the imaginary component of the next phasor that exhibits the zero value condition with the complex component that has unity amplitude comprises:
substituting the real component of the next phasor with the complex component that has unity amplitude when the imaginary component of the next phasor is zero; and
substituting the imaginary component of the next phasor with the complex component that has unity amplitude when the real component of the next phasor is zero.

9. The method of claim 1 further comprising employing a sampling rate that is at least twice the desired frequency.

10. A method for generating complex sinusoids of a desired frequency using an oscillator comprising the steps of:
multiplying a current phasor by a predetermined value (14) once every sampling interval to create a next phasor by the oscillator;
identifying if the next phasor is integer multiple of 45 degrees (16, 20) and substituting at least one component (18, 24) within the next phasor with a complex component that has unity amplitude or a complex component that has a square-root of one-half unity amplitude if the next phasor is determined to be integer multiple of 45 degrees by the oscillator;
determining an error factor (26) if the next phasor is not identified to be integer multiple of 45 degrees by the oscillator; and
correcting the real and imaginary components by removing the error factor (28) by the oscillator.

11. The method of claim 10, wherein the step of identifying is performed by examining logic values of a plurality of highest order bits of the next phasor to determine if the next phasor is integer multiple of 45 degrees.

12. The method of claim 10, wherein the step of identifying further comprises identifying if a zero value condition exist (16) within either real or imaginary components of the next phasor and substituting a complementary component of the real component or the imaginary component of the next phasor that exhibits the zero value condition with a complex component that has unity amplitude.

13. The method of claim 10, wherein the step of identifying further comprises identifying if a condition of equality exists (20) between absolute values of real and imaginary components of the next phasor and if the condition of equality exists substituting both the real and imaginary components of the next phasor with a complex component that has a square-root of one-half unity amplitude.

14. The method of claim 10, wherein the error factor, the real and imaginary components of the next phasor and corrected real and imaginary components satisfy:

$$x' = x - \varepsilon \times x,$$
$$y' = y - \varepsilon \times y,$$
$$\varepsilon = \frac{x^2 + y^2 - 1.0}{2},$$

where $\varepsilon$ represents the error factor, x and y represent the real and imaginary components of the next phasor, respectively, and x' and y' represent the corrected real and imaginary components of the next phasor, respectively.

15. A method for efficiently generating complex sinusoids of a desired frequency using an oscillator comprising the steps of:
successively multiplying a current phasor by a predetermined value once every sampling interval to create a plurality of next phasors by the oscillator; and
compensating for cumulative round-off errors (28) occurring within the next phasors by the oscillator, wherein the step of compensating comprises the step of examining logic values of a plurality of the most significant bit of the next phasors for the cumulative round-off errors, wherein the step of examining comprises the steps of:
detecting a condition of zero value (16) within components of the next phasors; and
substituting complementary components of components of the next phasors for which the condition of zero value is detected with complex components that have unity amplitudes, respectively.

16. The method of claim 15, wherein the step of examining further comprises the steps of:
detecting a condition of equal absolute-valued components (20) of the next phasors, wherein the detecting comprises identifying if absolute value of real component of a next phasor is equal to absolute value of imaginary component of the next phasor; and
substituting components of the next phasors that have been detected as having the condition of equal absolute-valued with complex components that have square-root of one-half unity amplitudes, respectively.

17. The method of claim 15 further comprises employing a processor whose sampling rate that is at least twice the desired frequency.

* * * * *